(12) United States Patent
Sharma et al.

(10) Patent No.: US 8,978,741 B2
(45) Date of Patent: Mar. 17, 2015

(54) DEVICE FOR REDUCING TEMPERATURE VARIATIONS IN PLENUMS

(75) Inventors: Ratnesh K. Sharma, Union City, CA (US); Cullen E. Bash, San Francisco, CA (US); Chandrakant D. Patel, Fremont, CA (US); Abdlmonem Beitelmal, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2883 days.

(21) Appl. No.: 11/357,531

(22) Filed: Feb. 17, 2006

(65) Prior Publication Data

US 2007/0194142 A1 Aug. 23, 2007

(51) Int. Cl.
*F28F 7/00* (2006.01)
*F24F 5/00* (2006.01)
*H05K 7/20* (2006.01)

(52) U.S. Cl.
CPC ............ *F24F 5/0017* (2013.01); *Y02E 60/147* (2013.01); *H05K 7/20745* (2013.01)
USPC ............. 165/80.4; 165/47; 165/48.1; 165/53; 165/128; 165/129; 165/130; 165/104.14; 165/104.33; 62/259.2; 62/185; 62/434; 62/201; 62/524; 62/526

(58) Field of Classification Search
USPC ........ 62/259.2, 185, 434, 201, 515, 524, 526; 165/47, 48.1, 53, 128–130, 80.4, 165/104.33, 104.14; 361/700; 257/715
See application file for complete search history.

(56) References Cited

U.S. PATENT DOCUMENTS

| | | | | |
|---|---|---|---|---|
| 3,609,991 A | * | 10/1971 | Chu et al. | 62/333 |
| 4,020,399 A | * | 4/1977 | Suzuki et al. | 361/700 |
| 4,237,965 A | * | 12/1980 | Hay | 165/48.2 |
| 5,259,363 A | * | 11/1993 | Peacock et al. | 126/621 |
| 5,467,609 A | * | 11/1995 | Feeney | 62/259.2 |
| 6,357,512 B1 | * | 3/2002 | Baer et al. | 165/48.2 |
| 6,418,748 B1 | * | 7/2002 | Kramer | 62/434 |
| 2004/0089011 A1 | * | 5/2004 | Patel et al. | 62/259.2 |
| 2005/0056033 A1 | * | 3/2005 | Gingras | 62/129 |

* cited by examiner

*Primary Examiner* — Frantz Jules
*Assistant Examiner* — Azim Abdur Rahim

(57) ABSTRACT

A device for reducing temperature variation in a plenum includes at least one pipe and a plurality of sumps containing a fluid operable to vary between a liquid state and a gaseous state depending upon a temperature of the fluid. The plurality of sumps are positioned at various locations within the plenum and the at least one pipe is in fluid communication with the plurality of sumps. In addition, the fluid, in the gaseous state, is caused to move through the at least one pipe and condense, thereby reducing the temperature at the location of the sump where the fluid was vaporized and thereby reducing temperature variation in the plenum.

19 Claims, 3 Drawing Sheets

DEVICE FOR REDUCING TEMPERATURE VARIATIONS IN PLENUMS

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Conventional data centers are typically equipped with a raised floor and ventilation tiles configured to provide cool air to the computer systems from a pressurized plenum in the space below the raised floor. Due to varying airflow patterns generated by multiple air conditioning units and non-uniform heat transfer from the plenum, temperatures often vary in different regions of the plenum. The different temperatures often lead to thermal management issues in racks and undesirable provisioning changes in the air conditioning units.

It would thus be beneficial to have the ability to reduce temperature variations in the plenum.

SUMMARY

A device for reducing temperature variation in a plenum is disclosed herein. The device includes at least one pipe and a plurality of sumps containing a fluid operable to vary between a liquid state and a gaseous state depending upon a temperature of the fluid. The plurality of sumps are positioned at various locations within the plenum and the at least one pipe is in fluid communication with the plurality of sumps. In addition, the fluid, in the gaseous state, is caused to move through the at least one pipe and condense, thereby reducing the temperature at the location of the sump where the fluid was vaporized and thereby reducing temperature variation in the plenum.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

A temperature variation reduction device for use in substantially equalizing temperature distributions in a plenum is disclosed. The temperature variation reduction device includes a fluid configured to vaporize when the fluid exceeds a predetermined temperature, thus absorbing heat and reducing the temperature of the surrounding air. Due to pressure differences, the vaporized fluid automatically flows to another location within the temperature variation reduction device where the heat is dissipated and the fluid is condensed. The condensed fluid may be returned to its original location or it may be moved to another location and this process may continuously be repeated to substantially equalize temperatures in the plenum.

The temperature variation reduction device comprises segments that may be attached to one another to generally enable the temperature variation reduction device to be deployed in a variety of configurations as well as to be modified after deployment. In addition, the temperature variation reduction device disclosed herein generally comprises a closed system with no mechanical moving parts and is thus configured to operate quietly and without substantial maintenance requirements.

Figure 1:
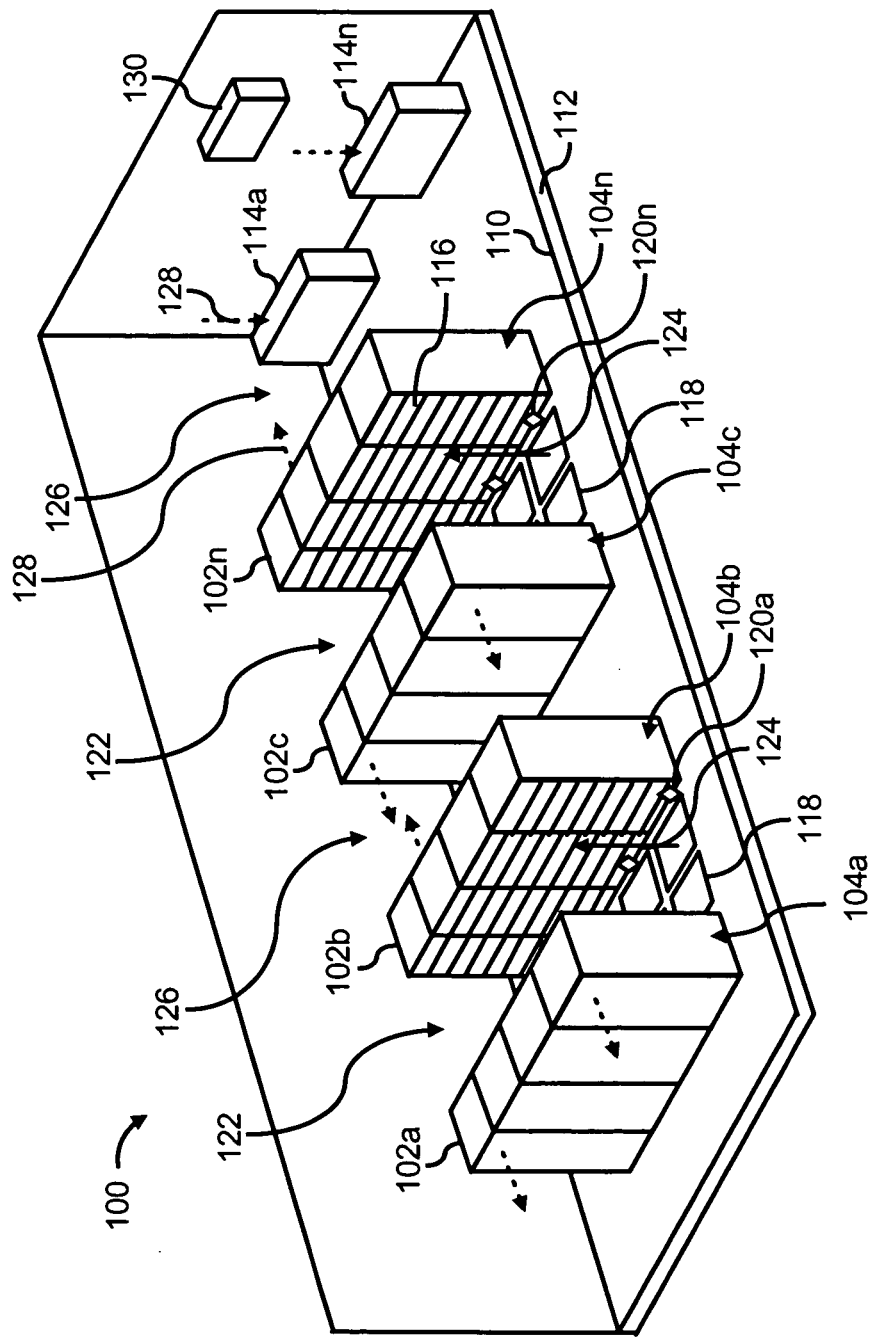
FIG. 1 shows a simplified perspective view of a room in which various examples of the temperature variation reduction device described herein may be practiced, according to an embodiment of the invention.

With reference first to FIG. 1, there is shown a simplified perspective view of a room 100 in which various examples of the temperature variation reduction device described herein may be practiced. It should be readily apparent to those of ordinary skill in the art that the room 100 depicted in FIG. 1 represents a generalized illustration and that other components may be added or existing components may be removed or modified without departing from a scope of the room 100.

As shown in FIG. 1, the room 100 contains a plurality of electronics cabinets or racks 102a-102n, where "n" is an integer equal to or greater than one. The racks 102a-102n are depicted as being arranged in respective rows 104a-104n, where again, "n" is an integer equal to or greater than one. In addition, the racks 102a-102n are illustrated as being aligned in parallel rows 104a-104n and positioned on a raised floor 110. It should however, be understood that the racks 102a-102n may be arranged in any reasonably suitable configuration and that the racks 102a-102n do not have to be positioned on a raised floor 110. In this regard, for instance, the racks 102a-102n may be positioned in a conventional computer room, such as a data center, or any other reasonably suitable room. The following description of the room 100, however, is directed to a data center environment having a raised floor for purposes of illustration.

The racks 102a-102n are generally configured to house a plurality of components 116 capable of generating/dissipating heat, for instance, processors, micro-controllers, highspeed video cards, memories, semi-conductor devices, and the like. The components 116 may comprise elements of a plurality of subsystems (not shown), for instance, computers, servers, bladed servers, etc. The subsystems and the components may be operated to perform various electronic functions, for instance, computing, switching, routing, displaying, and the like. A plurality of wires and communication lines (not shown) may be located in a space 112 beneath the raised floor 110. The space 112 may also function as a plenum for delivery of cooled air from one or more air conditioning (AC) units 114a-114n, where "n" is an integer equal to or greater than one. The AC units 114a-114n may comprise any reasonably suitable known AC unit configured to receive airflow, to cool the received airflow, and to supply the cooled airflow into the space 112.

The cooled airflow supplied into the space 112 may be delivered from the space 112 to the racks 102a-102n through vent tiles 118 located between some or all of the racks 102a-102n. The vent tiles 118 may comprise static vent tiles or the vent tiles 118 may comprise manually or remotely adjustable vent tiles. In the latter example, the vent tiles 118 may be manipulated to vary, for instance, the mass flow rates of cooled airflow supplied to the racks 102a-102n. In addition, the vent tiles 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104 patent, the vent tiles 118 are termed "dynamically controllable" because they generally operate to control at least one of velocity, volume flow rate and direction of the cooled airflow therethrough. In addition, specific examples of dynamically controllable vent tiles 118 may be found in U.S. Pat. No. 6,694,759, filed on Jan. 27, 2003, which is assigned to the assignee of the present invention and is incorporated by reference herein in its entirety.

The cooled air contained in the space 112 may include cooled air supplied by one or more AC units 114a-114n. In this regard, characteristics of the cooled air at various areas in the space 112 and the cooled air supplied to the racks 102a-102n may vary, for instance, due to mixing of the cooled air. In other words, the characteristics of the cooled air supplied to a particular location in the room 100 may differ from that of the cooled air supplied by a single AC unit 114a.

In addition, different areas within the space 112 may contain varying configurations and components, such as, wiring, supports, and other components. Thus, characteristics of the cooled air, such as, temperature, pressure, humidity, flow rate, etc., may substantially differ between the different areas within the space 112. In one regard, the differences in temperature, for instance, between the various areas may cause variations in the temperatures of the airflow supplied to the racks 102a-102n. As such, some of the racks 102a-102n may receive airflow that is at a different temperature as compared with the airflow received by other racks 102a-102n. These temperature variations may result in unintended provisioning changes in the AC units 114a-114n as well as potential capacity planning issues and hot spot formation in the room 100.

As described in greater detail herein below, one or more devices 200 (FIGS. 2A and 2B) designed to substantially reduce the temperature variations in the different areas of the space 112 are positioned at various locations in the space 112. More particularly, the temperature variation reduction device(s) 200 may comprise device(s) configured to substantially even out the temperatures in the space 112 and substantially minimize thermal management issues, such as hot spot formation, in the room 100.

In addition, or alternatively, the one or more devices 200 (FIGS. 2A and 2B) may be provided in a ceiling plenum (FIG. 2C) of the room 100. The ceiling plenum may be formed in the room 110 by a lowered ceiling (FIG. 2C). The ceiling plenum may be used, for instance, to collect and divert heated airflow away from the room 100 and to direct the heated airflow toward one or more AC units 114a-114n. In this example, the one or more devices 200 may be employed to substantially even out the temperatures of the airflow returned to the one or more AC units 114a-114n. As such, for instance, the one or more devices 200 may more evenly distribute the load on the AC units 114a-114n as compared with rooms 100 that do not have the temperature variation reduction device 200.

At least one condition, for instance, temperature, pressure, or humidity, of the cooled air supplied to various areas of the room 100 may be detected by optional sensors 120a-120n, where "n" is an integer equal to or greater than one. As shown, the sensors 120a-120n are represented as diamonds to distinguish them from other elements depicted in FIG. 1. In addition, the sensors 120a-120n are depicted as being positioned to detect the at least one condition at the inlets of the racks 102a-102n. In this example, the sensors 120a-120n may comprise temperature sensors or absolute humidity sensors. In another example, the sensors 120a-120n may be positioned within the space 112 near respective vent tiles 118 to detect the temperature, pressure, or humidity of the cooled air supplied through the respective vent tiles 118. Thus, although the sensors 120a-120n are depicted as being located on the raised floor 110, the sensors 120a-120n may be positioned at various other reasonably suitable locations, including, for example, near or within some or all of the components 116.

The areas between the rows labeled as 104a and 104b and between the rows labeled as 104c and 104n may comprise cool aisles 122. These aisles are considered "cool aisles" because they are configured to receive cooled airflow from the vent tiles 118, as generally indicated by the arrows 124. In addition, and as shown, the racks 102a-102n generally receive cooled air from the cool aisles 122. The aisles between the rows labeled as 104b and 104c, and on the rear sides of rows 104a and 104n, are considered hot aisles 126. These aisles are considered "hot aisles" because they are positioned to receive air that has been heated by the components 116 in the racks 102a-102n, as indicated by the arrows 128.

Although not shown, some or all of the racks 102a-102n may be positioned to each face the same direction, such that there are no distinct "hot aisles" and "cool aisles". Additionally, some or all of the racks 102a-102n may be positioned with their rear sides adjacent to one another. In this example, the vent tiles 118 may be provided in each aisle 122 and 126. In addition, the racks 102a-102n may comprise outlets on top panels thereof to enable heated air to flow out of the racks 102a-102n.

As described herein above, the AC units 114a-114n generally operate to cool heated air (arrows 128) received into the AC units 114a-114n. In addition, the AC units 114a-114n may supply the racks 102a-102n with airflow that has been cooled, through any reasonably suitable known manners and may thus comprise widely available, conventional AC units. For instance, the AC units 114a-114n may comprise vapor-compression type air conditioning units, chilled water air conditioning units, etc. Examples of suitable AC units 114a-114n may be found in co-pending and commonly assigned U.S. patent application Ser. No. 10/853,529, filed on May 26, 2004, and entitled "Energy Efficient AC Unit Operation," the disclosure of which is hereby incorporated by reference in its entirety.

Also shown in FIG. 1 is a resource manager 130 configured to perform various functions in the room 100. For instance, the resource manager 130 may operate the AC units 114a-114n based upon received information, such as, temperatures at various areas of the room 100. The resource manager 130 may also operate other elements in the room 100, including, for instance, controllable vent tiles 118. In addition or alternatively, the resource manager 130 may operate to control the placement of workload among the components 116 in the room 100.

Although the resource manager 130 is illustrated in FIG. 1 as comprising a component separate from the components 116 housed in the racks 102a-102n, the resource manager 130 may comprise one or more of the components 116 without departing from a scope of the room 100 disclosed herein. In addition, or alternatively, the resource manager 130 may comprise software configured to operate on a computing device, for instance, one of the components 116.

Figure 2A:
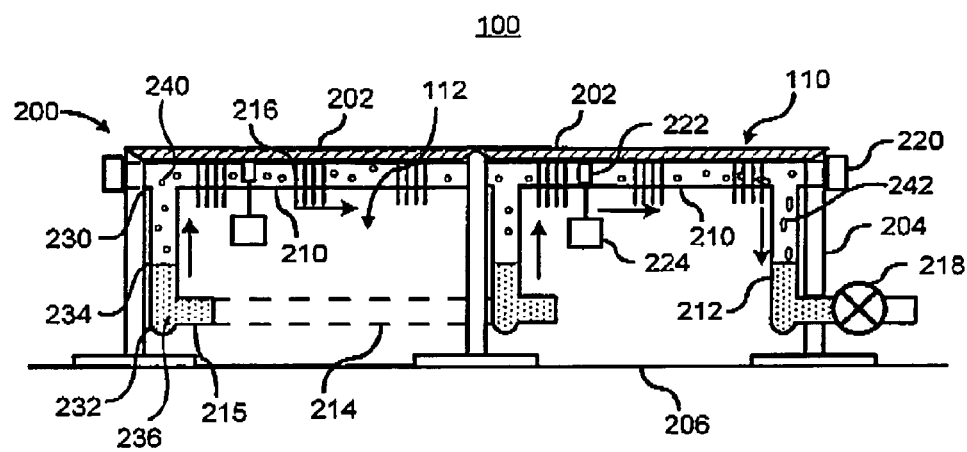
FIG. 2A shows a side view, partially in cross-section, of part of the room, within which the device for reducing temperature variation inside the space or plenum is shown in greater detail, according to an embodiment of the invention.

With particular reference now to FIG. 2A, there is shown a side view, partially in cross-section, of part of the room 100, within which a device 200 for reducing temperature variation inside the space or plenum 112 is shown in greater detail, according to an example. It should be readily apparent to those of ordinary skill in the art that the temperature variation reduction device 200 depicted in FIG. 2A represents a generalized illustration and that other components may be added or existing components may be removed or modified without departing from a scope of the temperature variation reduction device 200.

As shown in FIG. 2A, the raised floor 110 depicted in FIG. 1 includes floor tiles 202 placed on top of a plurality of pedestals 204. In addition, the pedestals 204 are positioned on top of a subfloor 206 and the plenum 112 is formed between the floor tiles 202 and the subfloor 206. The floor tiles 202 may comprise the vent tiles 118 or other types of floor tiles, such as those that do not contain openings for allowing airflow through the floor tiles.

Figure 2B:
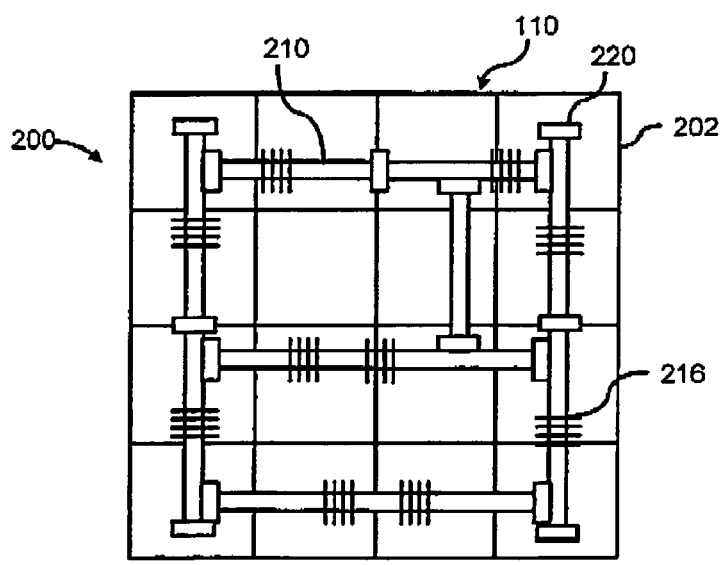
FIG. 2B shows a bottom view of part of the raised floor including the temperature variation reduction device depicted in FIGS. 1 and 2A, according to an embodiment of the invention.
Figure 2C:
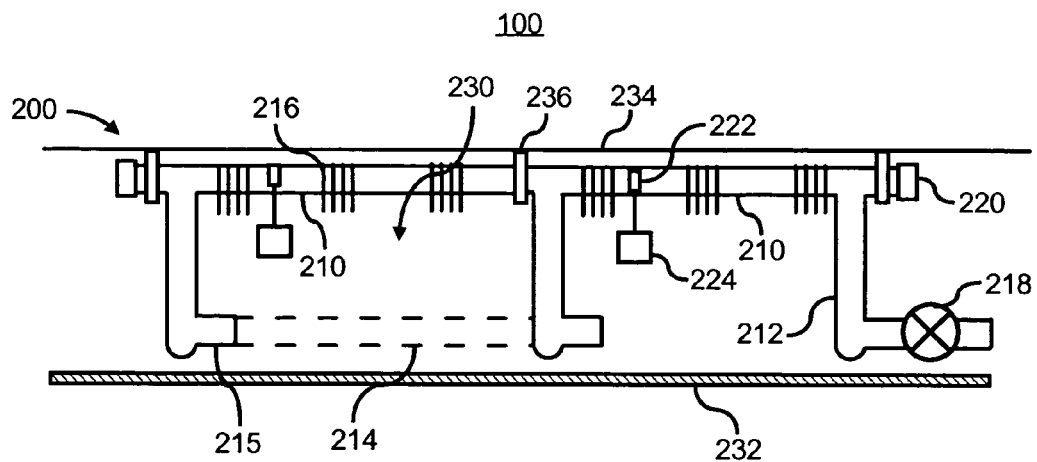
FIG. 2C shows a side view, partially in cross-section, of another part of the room depicted in FIG. 1, in which a device for reducing temperature variation may be employed, according to an embodiment of the invention.

A temperature variation reduction device 200, such as a thermosyphon, vapor chamber, and the like, is depicted as being positioned within the plenum 112. As shown, the temperature variation reduction device 200 generally comprises a series of pipes 210 connected in a linear topology. The temperature variation reduction device 200 may also include pipes 210 that extend into the plane of the view depicted in FIG. 2A. In this regard, the temperature variation reduction device 200 may comprise a series of pipes 210 connected in a substantially grid topology, as shown in FIG. 2B, which is described in greater detail herein below. In addition, the temperature variation reduction device 200 may comprise any reasonably suitable material, such as, any reasonably suitable high conductivity metal or metal alloy, plastic, glass, combinations thereof, etc.

In any regard, the temperature variation reduction device 200 may be supported in the plenum 112 in any of a variety of manners. For instance, the temperature variation reduction device 200 may comprise a substantially free-standing structure and may thus be self-supporting on the subfloor 206. As another example, the temperature variation reduction device 200 may be supported by the pedestals 204, horizontally extending supports (not shown) for the floor tiles 202, or any other reasonably suitable support. In addition, the temperature variation reduction device 200 may be attached to one or more supports through use of mechanical fasteners, adhesives, welds, or the like.

The temperature variation reduction device 200 is also depicted as including sumps 212 that contain a fluid 236 operable to vaporize at temperatures between about 10 to 30 degrees C., such as, for instance, water at relatively low pressure, methanol, fluorinert, a refrigerant, such as R134a, and the like. The choice of fluid employed in the temperature variation reduction device 200 may depend upon a plurality of factors, including, for instance, cooling requirements, environmental impact, cost, etc.

The sumps 212 may provide relatively uniform fluid supply to different regions of the temperature variation reduction device 200 and may substantially prevent starvation of fluid from the different regions. In addition, the sumps 212 may include stubs 215 to generally ensure that the fluid is relatively evenly distributed across various regions of the temperature variation reduction device 200.

As shown, the sumps 212 are in fluid communication with respective ones of the pipes 210 to generally enable the fluid to be moved from one sump 212 to another through one or more of the pipes 210. The sumps 212 are, more particularly depicted as including a first end 230, a second end 232 and an intermediate section 234 extending between the first end 230 and the second end 232. The first end 230 is depicted as being connected in fluid communication with a pipe 210 and the second end 232 is depicted as comprising a chamber having an opening in fluid communication with the intermediate section 234. For instance, in regions of the plenum 112 having sufficiently high temperatures, the fluid contained in the sumps 212 located in those regions may vaporize, as denoted by the circles 240, and diffuse to sumps 212 located in other regions of the plenum 112 having sufficiently low temperatures due to pressure differences within the sumps 212.

More particularly, the local pressure of the fluid may be reduced as the fluid condenses, which is depicted as condensing vapors 242, from the gaseous state 240. The pressure gradient caused by the reduction in local pressure may drive the flow of vapor 240 towards the cooler regions of the plenum 112, which are depicted by the arrows. As the hotter air in the plenum 112 vaporizes the fluid, the temperature of that air may be reduced through heat transfer into the fluid from the hotter air. This process may continue until the pressure gradient is substantially reduced and the temperature in the plenum 112 is substantially uniform. In addition, the vapor-liquid transformation may be driven by changes in the saturation temperature of the fluid due to the pressure rise caused by vaporization.

The sumps 212 may be connected to one or more other sumps 212 through an optional connection line 214 (shown in dashed lines). The optional connection line 214 may be implemented in situations where fluid continuity is desired in the temperature variation reduction device 200.

One or more of the sumps 212 may also be connected to a fluid source (not shown). In one regard, for instance, the fluid source may supply fluid into the one or more sumps 212 when an additional pipe 210 is attached to the temperature variation reduction device 200. The fluid source may supply the one or more sumps 212 with the fluid and the supply of fluid may be controlled by a valve 218. The valve 218 may comprise a manually actuated valve, an electronically actuated valve, an automatically actuated valve, etc. In addition, an optional pump (not shown) may be implemented to apply sufficient force on the fluid to be supplied into the one or more sumps 212.

As further shown, the temperature variation reduction device 200 may include fins 216 operable to increase heat transfer between the fluid contained in the pipes 210 and surrounding air. As such, the fins 216 generally provide greater surface areas over which heat may be transferred from the vaporized fluid to thereby cause the vaporized fluid to condense back into liquid form in the pipes 210. In one regard, the fins 216 may comprise substantially straight fins or helical fins. In addition, the fins 216 may be attached to respective pipes 210 in any reasonably suitable manner that allows for a relatively high level of heat transfer between the fluid and the fins 216. Moreover, the fins 216 may comprise any reasonably suitable material capable of dissipating heat in a relatively efficient manner. Although the fins 216 have been depicted as being spaced apart from each other with gaps therebetween, it should be understood that the fins 216 may be provided along the pipes 210 in any reasonably suitable configuration.

The temperature variation reduction device 200 may also include connectors 220 for enabling the pipes 210 to be connected to other pipes 210. The connectors 220 may comprise any reasonably suitable types of connectors capable of connecting adjacent pipes 210 in fluid communication with each other. In addition, the pipes 210 may, for instance, comprise male-type connectors and female-type connectors on opposite sides of the pipes 210 to thereby enable the pipes 210 to be connected to each other. Moreover, the connectors 220 may comprise any reasonably suitable and commercially available dripless disconnects. For instance, the connectors 220 may comprise couplings available from AEROQUIP Corporation or FASTER Inc, both of Maumee, Ohio.

Although connectors 220 have been depicted in FIG. 2A, it should be understood that the pipes 210 may be attached to one another through any other reasonably suitable manner. For instance, the pipes 210 may be welded to each other, may have integrally formed mating devices, etc.

According to another example, one or more pressure transducers 222 may be provided to monitor the operating pressure of the temperature variation reduction device 200. In addition, the pressure transducers 222 may be connected to an alarm 224 which may be triggered, for instance, when pressure alterations in the temperature variation reduction device 200 are detected to exceed a predetermined level or occur in a relatively rapid manner. Thus, for instance, the pressure transducers 222 and the alarm 224 may be employed to signal an indication of pressure alterations that may be caused due to a fire or other disaster.

The one or more pressure transducers 222 may also be employed to determine the mean pressure inside the temperature variation reduction device 200. The mean pressure may be used to monitored, for instance, to detect for leakages in the temperature variation reduction device 200. The mean pressure may also be monitored to determine when additional fluid is to be added into the temperature variation reduction device 200.

With reference now to FIG. 2B, there is shown a bottom view of part of the raised floor 110 depicted in FIGS. 1 and 2A. It should be readily apparent to those of ordinary skill in the art that the temperature variation reduction device 200 depicted in FIG. 2A represents a generalized illustration and that other components may be added or existing components may be removed or modified without departing from a scope of the temperature variation reduction device 200.

The temperature variation reduction device 200 is depicted as comprising a plurality of pipes 210 connected to each other with connectors 220. As shown, the temperature variation reduction device generally comprises a monolithic network of pipes 210 spanning, in two dimensions, part of the plenum 112 underneath the floor tiles 202. In addition, although not shown, the pipes 210 may be positioned underneath vent tiles 118 such that the pipes 210 are in the path of airflow through the vent tiles 118 to facilitate heat transfer from the fluid in the pipes 210.

Through use, for instance, of the connectors 220, the temperature variation reduction device 200 may be modified in a relatively simple manner. For instance, additional pipes 210 and sumps 212 may be added to the temperature variation reduction device 200 by simply connecting the connectors 220 of the additional pipes 210 to the connectors 220 of existing pipes 210. In addition, some of the pipes 210 and sumps 212 may also be removed from the temperature variation reduction device 200 in a reasonably simple manner. As such, the temperature variation reduction device 200 may be configured, and re-configured, as desired, to, for instance, substantially minimize temperature variations in the plenum 112.

Although the temperature variation reduction device 200 has been described as being placed in a plenum formed beneath a raised floor, the temperature variation reduction device 200 may be positioned within a plenum formed above a lowered ceiling (not shown) of the room 100 according to another example. In this example, for instance, the temperature variation reduction device 200 may be employed to reduce temperature variations in the plenum of a cooling system that delivers cooling airflow from the lowered ceiling in manners similar to those described above with respect to the raised floor 110.

Turning now to FIG. 2C, there is shown a side view, partially in cross-section, of another part of the room 100, in which a device 200 for reducing temperature variation may be employed, according to an example. It should be readily apparent to those of ordinary skill in the art that the temperature variation reduction device 200 depicted in FIG. 2C represents a generalized illustration and that other components may be added or existing components may be removed or modified without departing from a scope of the temperature variation reduction device 200.

The temperature variation reduction device 200 depicted in FIG. 2C includes all of the features and operates in manners similar to those described herein above with respect to FIGS. 2A and 2B. As such, only those elements that differ in FIG. 2C will be discussed herein. In addition, the temperature variation reduction device 200 depicted in FIG. 2C may be employed to substantially even out the temperatures of the airflow returned to the one or more AC units 114a-114n. As such, for instance, the temperature variation reduction device 200 may more evenly distribute the load on the AC units 114a-114n as compared with rooms 100 that do not have the temperature variation reduction device 200.

The temperature variation reduction device 200 is generally depicted as being positioned within a ceiling plenum 230 formed between an optional lowered ceiling 232 and the ceiling 234 of the room 100. The lowered ceiling 232 is considered optional because the temperature variation reduction device 200 may be placed near the ceiling 234 of the room 100 without the lowered ceiling 232.

In any regard, the temperature variation reduction device 200 may be attached to the ceiling 234 through use of mechanical connectors 236. The mechanical connectors 236 may comprise any reasonably suitable types of connectors capable of supporting the temperature variation reduction device 200 on the ceiling 234. Suitable mechanical connectors 236 may include mechanical fasteners, such as, brackets, wires, cables, etc. In addition, or alternatively, the temperature variation reduction device 200 may be supported on the ceiling 234 through any other reasonably suitable means, such as, through use of adhesives, welds, etc.

Figure 3:
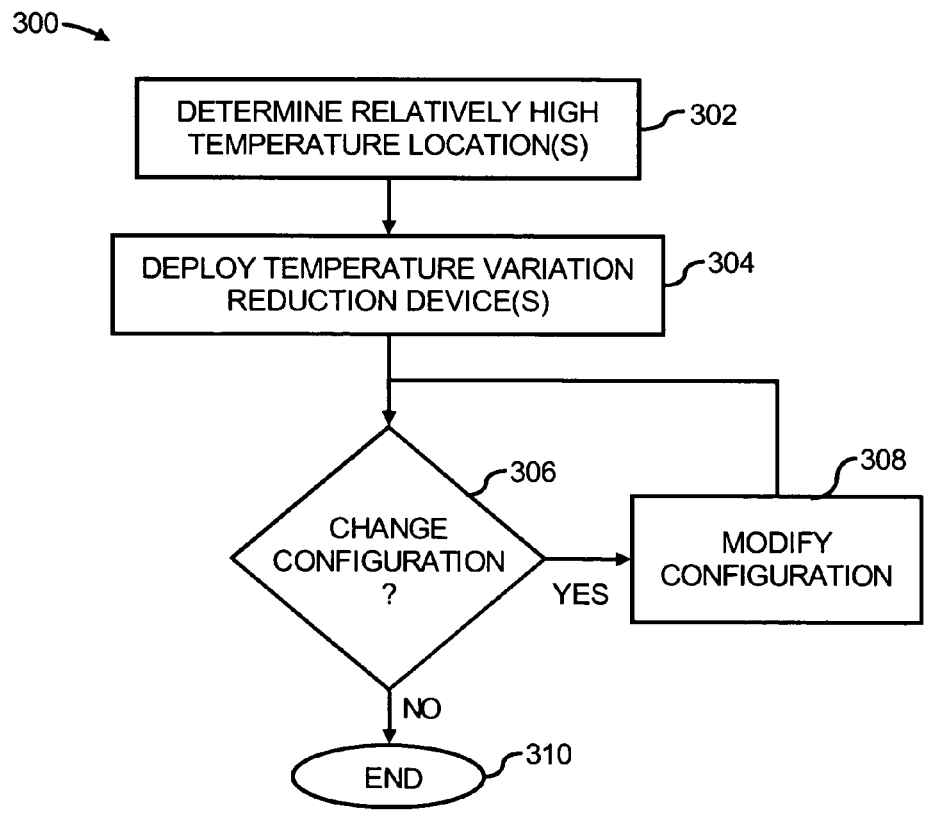
FIG. 3 shows a flow diagram of a method for reducing temperature variation in a plenum, according to an embodiment of the invention.

FIG. 3 shows a flow diagram of a method 300 for reducing temperature variation in a plenum, according to an example. It should be apparent to those of ordinary skill in the art that the method 300 represents a generalized illustration and that other steps may be added or existing steps may be removed, modified or rearranged without departing from a scope of the method 300. Although particular reference to the elements shown in FIGS. 2A-2C is made in the description of the method 300, it should be understood that the method 300 is not limited to being implemented by the elements shown in FIGS. 2A-2C and may be implemented by more, less, or different elements as those shown in FIGS. 2A-2C.

Generally speaking, the method 300 may be implemented to substantially reduce temperature variations in a plenum 112 by transferring heat from relatively hotter locations of the plenum 112 to relatively cooler locations in the plenum 112. In addition, the heat may be transferred in a substantially automatic manner through use of the temperature variation reduction device 200 disclosed herein.

At step 302, the locations of one or more relatively high temperature areas in the plenum 112, 230 may be determined. These locations may be determined through, for instance, direct measurement of the various locations in the plenum 112, 230. Alternatively, these locations may be determined substantially indirectly through, for instance, detection of temperatures or other environmental conditions in areas above the plenum 112, 230. In the latter example, the environmental conditions may be detected, for instance, by the sensors 120a-120n and the locations of the one or more relatively high temperature areas in the plenum 112, 230 may be correlated to the locations of the sensors 120a-120n. As such, the locations of the one or more relatively high temperature areas in the plenum 112, 230 may be manually or automatically determined at step 302.

At step 304, one or more temperature variation reduction devices 200 may be deployed in the plenum 112, 230. In a first example, the one or more temperature variation reduction devices 200 may be deployed in the locations of the one or more relatively high temperature areas determined at step 302. In a second example, the one or more temperature variation reduction devices 200 may be deployed in any other reasonably suitable manner, such as, for instance, throughout the plenum 112, 230, in a relatively random manner, in particular zones of the plenum 112, 230, etc.

Once deployed, a determination as to whether the configurations of the one or more temperature variation reduction devices 200 are to be changed may be made as indicated at step 306. A determination to change the configuration of the one or more temperature variation reduction devices 200 may be made, for instance, in situations where the configuration of the room 100 has been changed, thereby changing the airflow characteristics in the plenum 112, 230. As another example, a determination to change the configuration may be made in situations where it is determined that the original deployment of the one or more temperature variation reduction devices 200 yielded a less than desired performance.

In any respect, the configurations of the one or more temperature variation reduction devices 200 may be modified in response to a selection to change the configuration, as indicated at step 308. More particularly, for instance, additional pipes 210 and sumps 212 may be attached to the one or more temperature variation reduction devices 200 to thereby increase the area over which temperature variations may be reduced. The additional pipes 210 may be attached, for instance, through use of the connectors 220. In this example, additional fluid may also be introduced into the one or more temperature variation reduction devices 200 to compensate for the space required by the additional pipes 210 and sumps 212. As another example, existing pipes 210 and sumps 212 may be removed or repositioned.

Following step 308, a determination as to whether the configurations of the one or more temperature variation reduction devices 200 are to be changed may again be made as indicated at step 306. In addition, steps 306 and 308 may be repeated for as many times as desired or until, for instance, the one or more temperature variation reduction devices 200 are in substantially optimal configurations. Thus, when it is determined that the configurations of the one or more temperature variation reduction devices 200 are not to be changed at step 306, the method 300 may end as indicated at step 310. It should, however, be understood that steps 306 and 308 may be repeated at any time to thus substantially reduce temperature variations in the plenum 112, 230.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A device for reducing temperature variation in a plenum, said device comprising:
   at least one pipe; and
   a plurality of sumps positioned below the at least one pipe, wherein each of the plurality of sumps comprises a first end, a second end, and an intermediate section extending between the first end and the second end, wherein the first end is connected in fluid communication with the at least one pipe and wherein the second end comprises a chamber having an opening in fluid communication with the intermediate section, said chamber containing a fluid operable to vary between a liquid state and a gaseous state depending upon a temperature of the fluid, wherein the fluid is configured to be in the liquid state and to vaporize when the temperature of the fluid exceeds a predetermined temperature, and wherein the vaporized fluid is configured to move through the at least one pipe to another one of the plurality of sumps positioned in a location having a temperature lower than the predetermined temperature and to condense into the another one of the plurality of sumps, thereby reducing the temperature of air around the locations of the plurality of sumps where the fluid was vaporized and thereby reducing temperature variation in the plenum.

2. The device according to claim 1, wherein the plenum is formed by at least one ventilation tile having an opening and wherein the at least one pipe is positioned in an airflow path of the opening.

3. The device according to claim 1, wherein the at least one pipe comprises a plurality of fins configured to substantially enhance heat transfer from the fluid to ambient air.

4. The device according to claim 1, wherein the plurality of sumps comprises stubs operable to relatively evenly distribute the fluid across the plurality of sumps positioned at various regions in the plenum, wherein the stubs form parts of the chambers.

5. The device according to claim 1, wherein the plurality of sumps are in fluid communication with each other through a connection line thereby connecting the chambers of multiple ones of the plurality of sumps, wherein the connection line enables fluid in the liquid state to flow between a plurality of sumps.

6. The device according to claim 1, further comprising:
a valve configured to control a supply of fluid from a fluid source to at least one of the plurality of sumps.

7. The device according to claim 1, further comprising:
a plurality of connectors configured to enable the at least one pipe to be connected in fluid communication with at least one other pipe.

8. The device according to claim 1, further comprising:
a pressure transducer configured to detect pressure changes in the at least one pipe; and
an alarm, wherein the alarm is configured to become activated in response to at least one of a relatively rapid pressure change and a substantially large pressure change detected by the pressure transducer.

9. The device according to claim 1, wherein the at least one pipe and the plurality of sumps comprise at least one of a relatively high conductivity metal and a relatively high conductivity metal alloy.

10. The device according to claim 1, wherein the fluid is operable to vaporize at temperatures between about 10 and 30 degrees Celsius.

11. The device according to claim 1, wherein the fluid comprises at least one of water, methanol, fluorinert, and a refrigerant.

12. The device according to claim 1, wherein the at least one pipe and the plurality of sumps comprise freestanding structures.

13. The device according to claim 1, wherein the plenum is formed by a raised floor supported by a plurality of supports, and wherein the at least one pipe and the plurality of sumps are supported by the plurality of supports.

14. The device according to claim 1, further comprising:
a plurality of pipes, wherein the plurality of pipes and the plurality of sumps are arranged in a grid formation in the plenum.

15. A room housing electronics equipment, said room comprising:
a plenum; and
a temperature variation reduction device positioned in the plenum, said temperature variation reduction device comprising at least one pipe and a plurality of sumps positioned below the at least one pipe, wherein each of the plurality of sumps comprises a first end, a second end, and an intermediate section extending between the first end and the second end, wherein the first end is connected in fluid communication with the at least one pipe and wherein the second end comprises a chamber having an opening in fluid communication with the intermediate section, said chamber containing a fluid operable to vary between a liquid state and a gaseous state depending upon a temperature of the fluid, wherein the fluid is configured to be in the liquid state and to vaporize when the temperature of the fluid exceeds a predetermined temperature, and wherein the vaporized fluid is configured to move through the at least one pipe to another one of the plurality of sumps positioned in a location in the plenum having a temperature lower than the predetermined temperature and to condense into the another one of the plurality of sumps, thereby reducing temperature variation in air contained in the plenum.

16. The room according to claim 15, wherein the plurality of sumps comprises stubs operable to relatively evenly distribute the fluid across the plurality of sumps positioned at various regions in the plenum, wherein the stubs form parts of the chambers.

17. The room according to claim 16, wherein the plurality of sumps are in fluid communication with each other through a connection line thereby connecting the chambers of multiple ones of the plurality of sumps, wherein the connection line enables fluid in the liquid state to flow between a plurality of sumps.

18. The room according to claim 16, wherein the temperature variation reduction device further comprises:
a pressure transducer configured to detect pressure changes in the at least one pipe; and
an alarm, wherein the alarm is configured to become activated in response to at least one of a relatively rapid pressure change and a substantially large pressure change detected by the pressure transducer.

19. The room according to claim 16, wherein the plenum is positioned on at least one of a floor, ceiling, and a wall of the room.

* * * * *